(12) United States Patent
Fang et al.

(10) Patent No.: US 12,002,871 B2
(45) Date of Patent: *Jun. 4, 2024

(54) SEMICONDUCTOR DEVICE STRUCTURE WITH WORK FUNCTION LAYER AND METHOD FOR FORMING THE SAME

(71) Applicant: TAIWAN SEMICONDUCTOR MANUFACTURING COMPANY, LTD., Hsinchu (TW)

(72) Inventors: Wen-Han Fang, New Taipei (TW); Chang-Yin Chen, Taipei (TW); Ming-Chia Tai, Zhubei (TW); Po-Chi Wu, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/079,534

(22) Filed: Dec. 12, 2022

(65) Prior Publication Data
US 2023/0111895 A1 Apr. 13, 2023

Related U.S. Application Data

(63) Continuation of application No. 17/007,829, filed on Aug. 31, 2020, now Pat. No. 11,527,636, which is a
(Continued)

(51) Int. Cl.
*H01L 29/66* (2006.01)
*H01L 21/8238* (2006.01)
(Continued)

(52) U.S. Cl.
CPC .......... *H01L 29/66545* (2013.01); *H01L 21/823821* (2013.01); *H01L 21/823842* (2013.01);
(Continued)

(58) Field of Classification Search
None
See application file for complete search history.

(56) References Cited

U.S. PATENT DOCUMENTS 8,524,588 B2 9/2013 Lin et al.
8,723,236 B2 5/2014 Liu et al.
(Continued)

*Primary Examiner* — Feifei Yeung Lopez
(74) *Attorney, Agent, or Firm* — Birch, Stewart, Kolasch & Birch, LLP

(57) ABSTRACT

A method for forming a semiconductor device structure is provided. The method includes forming a first fin structure and a second fin structure over a substrate. The method includes forming a dielectric layer over the substrate, the first fin structure, and the second fin structure. The method includes forming a first work function layer in the first trench and the second trench. The method includes forming a first mask layer over the first work function layer in the first trench. The method includes removing the first work function layer exposed by the first mask layer. The method includes removing the first mask layer. The method includes forming a first gate electrode in the first trench and a second gate electrode in the second trench. The method includes forming a first hard mask layer in the first trench and a second hard mask layer in the second trench.

20 Claims, 16 Drawing Sheets

Related U.S. Application Data continuation of application No. 16/183,995, filed on Nov. 8, 2018, now Pat. No. 10,763,341, which is a continuation of application No. 14/509,576, filed on Oct. 8, 2014, now Pat. No. 10,134,861.

(51) Int. Cl.
- *H01L 27/092* (2006.01)
- *H01L 29/423* (2006.01)
- *H01L 29/49* (2006.01)

(52) U.S. Cl.
CPC .... *H01L 27/0924* (2013.01); *H01L 29/42376* (2013.01); *H01L 29/4238* (2013.01); *H01L 29/4966* (2013.01)

(56) References Cited

U.S. PATENT DOCUMENTS

| | | |
|---|---|---|
| 9,012,319 B1 | 4/2015 | Choi et al. |
| 9,093,467 B1 | 7/2015 | Xie et al. |
| 9,263,540 B1 | 2/2016 | Lin et al. |
| 10,134,861 B2 | 11/2018 | Fang et al. |
| 10,763,341 B2 | 9/2020 | Fang et al. |
| 11,527,636 B2 * | 12/2022 | Fang ................. H01L 29/42376 |
| 2005/0242395 A1 | 11/2005 | Chen et al. |
| 2006/0006478 A1 | 1/2006 | Kanegae et al. |
| 2006/0289920 A1 | 12/2006 | Wu et al. |
| 2007/0111419 A1 | 5/2007 | Doyle et al. |
| 2008/0116503 A1 | 5/2008 | Tsurumi et al. |
| 2011/0156107 A1 | 6/2011 | Bohr et al. |
| 2011/0169101 A1 | 7/2011 | Doornbos et al. |
| 2012/0313178 A1 | 12/2012 | Liao et al. |
| 2013/0005128 A1 | 1/2013 | Ng et al. |
| 2013/0260549 A1 | 10/2013 | Jagannathan et al. |
| 2014/0008720 A1 | 1/2014 | Xie et al. |
| 2014/0070320 A1 * | 3/2014 | Mukherjee ...... H01L 21/823456 438/585 |
| 2014/0131809 A1 | 5/2014 | Ando et al. |
| 2014/0167187 A1 | 6/2014 | Kuo et al. |
| 2015/0171084 A1 | 6/2015 | Lin et al. |
| 2015/0243563 A1 | 8/2015 | Lee et al. |
| 2016/0071944 A1 | 3/2016 | Lu et al. |

\* cited by examiner

SEMICONDUCTOR DEVICE STRUCTURE WITH WORK FUNCTION LAYER AND METHOD FOR FORMING THE SAME

CROSS REFERENCE

This application is a Continuation of U.S. application Ser. No. 17/007,829, filed on Aug. 31, 2020, which is a Continuation of U.S. application Ser. No. 16/183,995, filed on Nov. 8, 2018, which is a Continuation of U.S. application Ser. No. 14/509,576, filed on Oct. 8, 2014, the entirety of which are incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since the feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
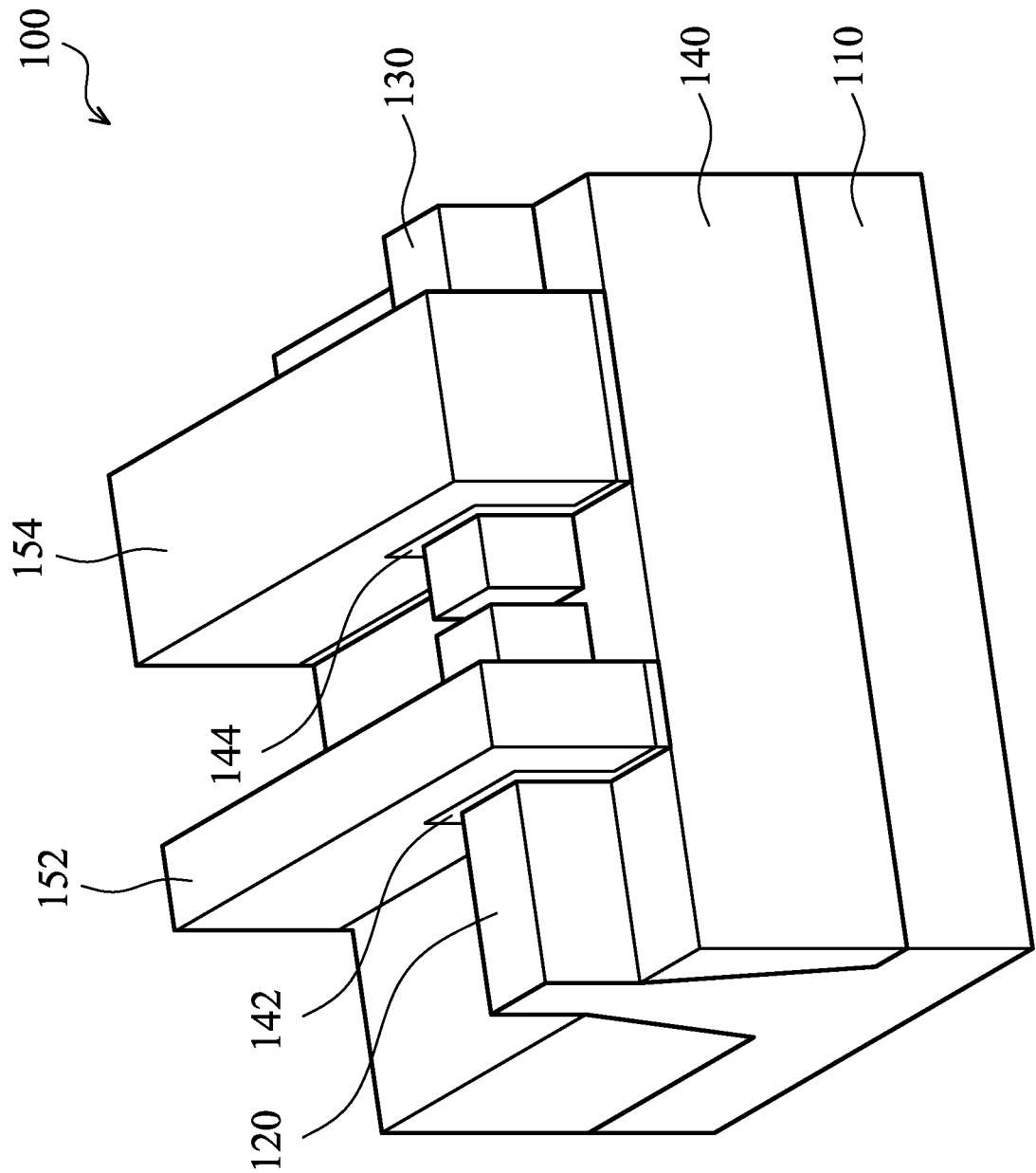
FIG. 1A is a perspective view of a stage of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1B:
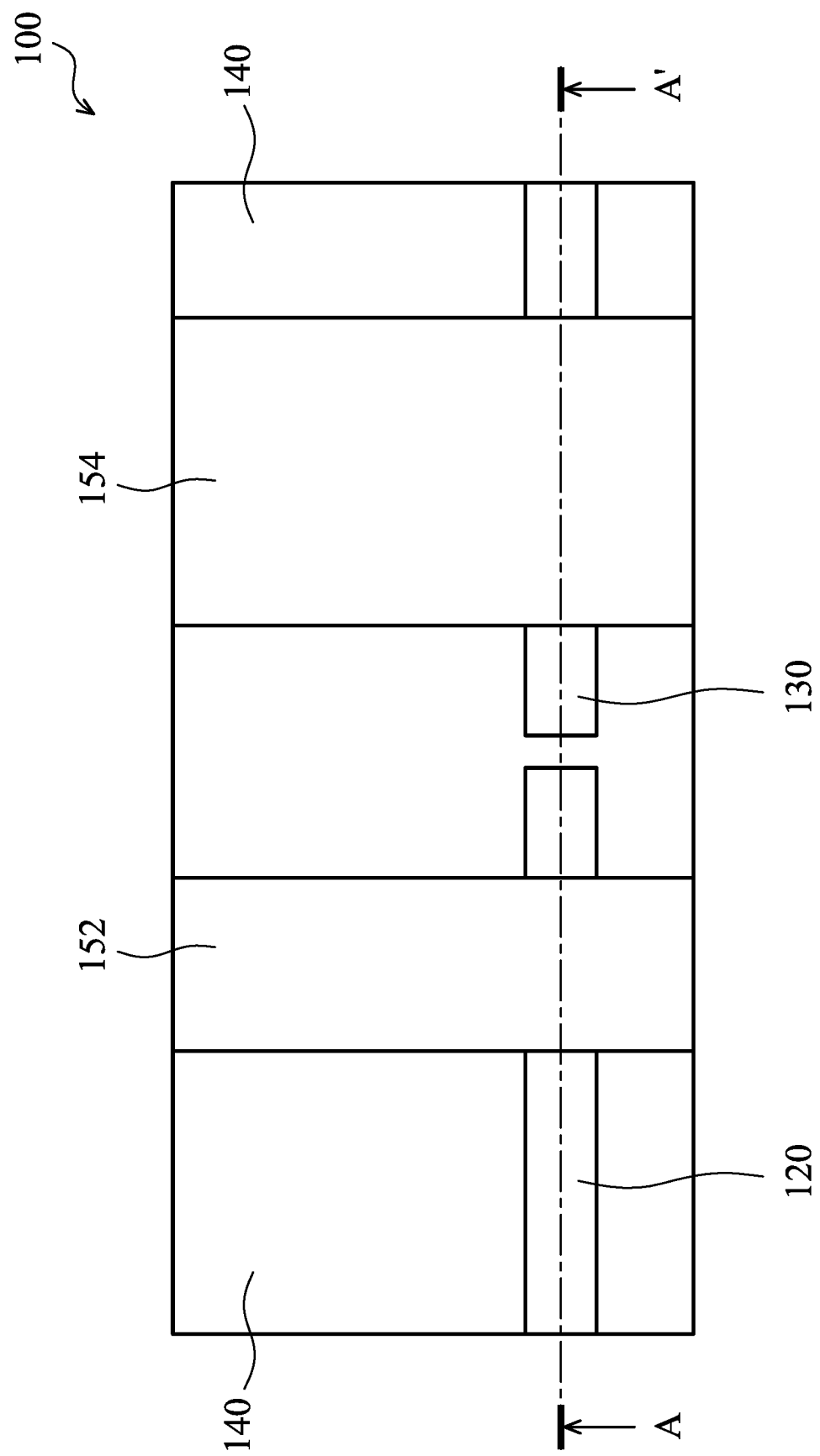
FIG. 1B is a top view of a semiconductor structure of FIG. 1A, in accordance with some embodiments.
Figure 2A:
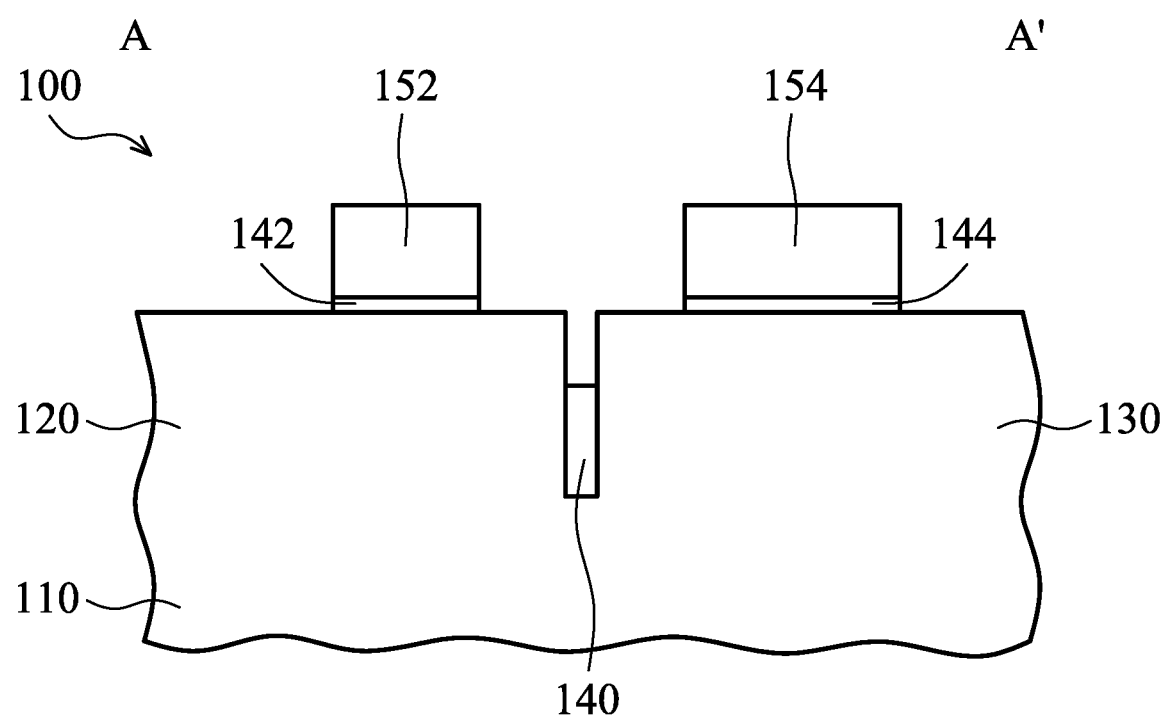
FIGS. 2A-2P are cross-sectional views of various stages of a process for forming a semiconductor device structure, in accordance with some embodiments.

FIG. 1A is a perspective view of a stage of a process for forming a semiconductor device structure, in accordance with some embodiments. FIG. 1B is a top view of a semiconductor structure 100 of FIG. 1A, in accordance with some embodiments. FIG. 2A is a cross-sectional view of the semiconductor structure 100 taken along line A-A' in FIG. 1B, in accordance with some embodiments.

As shown in FIGS. 1A, 1B, and 2A, a substrate 110 is provided, in accordance with some embodiments. The substrate 110 includes a semiconductor wafer (such as a silicon wafer) or a portion of a semiconductor wafer. In some embodiments, the substrate 100 is made of an elementary semiconductor material including silicon or germanium in a single crystal, polycrystal, or amorphous structure.

In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or combinations thereof. The substrate 110 may also include multi-layer semiconductors, semiconductor on insulator (SOI) (such as silicon on insulator or germanium on insulator), or combinations thereof.

In addition, the substrate 110 may include structures such as doped regions, interlayer dielectric (ILD) layers, and/or conductive features. Furthermore, the substrate 110 may further include single or multiple material layers. For example, the material layers may include a silicon layer, a dielectric layer, and/or a doped poly-silicon layer.

As shown in FIGS. 1A, 1B, and 2A, fin structures 120 and 130 are formed over the substrate 110, in accordance with some embodiments. The fin structures 120 and 130 are spaced apart from each other, in accordance with some embodiments. In some embodiments, the fin structures 120 and 130 are formed by patterning the substrate 110.

For example, the formation of the fin structures 120 and 130 includes forming a patterned photoresist layer with openings (not shown) overlying the substrate 110; performing an etching process to remove a portion of the substrate 110 through openings; and removing the patterned photoresist layer. The etching process includes a reactive ion etch (RIE) or other suitable processes.

As shown in FIGS. 1A, 1B, and 2A, an isolation layer 140 is formed over the substrate 110 and surrounds the fin structures 120 and 130, in accordance with some embodiments. The isolation layer 140 includes an insulating material, in accordance with some embodiments. The insulating material includes silicon oxide, silicon nitride, silicon oxynitride, another applicable material, or a combination thereof. The formation of the isolation layer 140 includes forming an isolation material layer (not shown) over the substrate 110 and the fin structures 120 and 130; and performing an etching back process on the isolation material layer to expose top portions of the fin structures 120 and 130, in accordance with some embodiments. The etching back process includes a dry etching process, in accordance with some embodiments.

As shown in FIGS. 1A, 1B, and 2A, dummy gate dielectric layers 142 and 144 are formed over the fin structures 120 and 130, respectively, in accordance with some embodiments. The dummy gate dielectric layers 142 and 144 are made of silicon oxide, in accordance with some embodiments. Dummy gates 152 and 154 are formed over the dummy gate dielectric layers 142 and 144, respectively, in accordance with some embodiments. The dummy gates 152 and 154 are made of polysilicon, in accordance with some embodiments. The dummy gates 152 and 154 are spaced apart from each other, in accordance with some embodiments.

The formation of the dummy gate dielectric layers 142 and 144 and the dummy gates 152 and 154 includes depositing a dummy gate dielectric material layer (not shown) over the isolation layer 140 and the fin structures 120 and 130; depositing a dummy gate material layer (not shown) over the dummy gate dielectric material layer; and patterning the dummy gate material layer and the dummy gate dielectric material layer by a photolithography process and an etching process, in accordance with some embodiments.

The dummy gate dielectric material layer is deposited using a chemical vapor deposition process (CVD process), in accordance with some embodiments. The dummy gate material layer is deposited using a chemical vapor deposition process, in accordance with some embodiments.

Figure 2B:
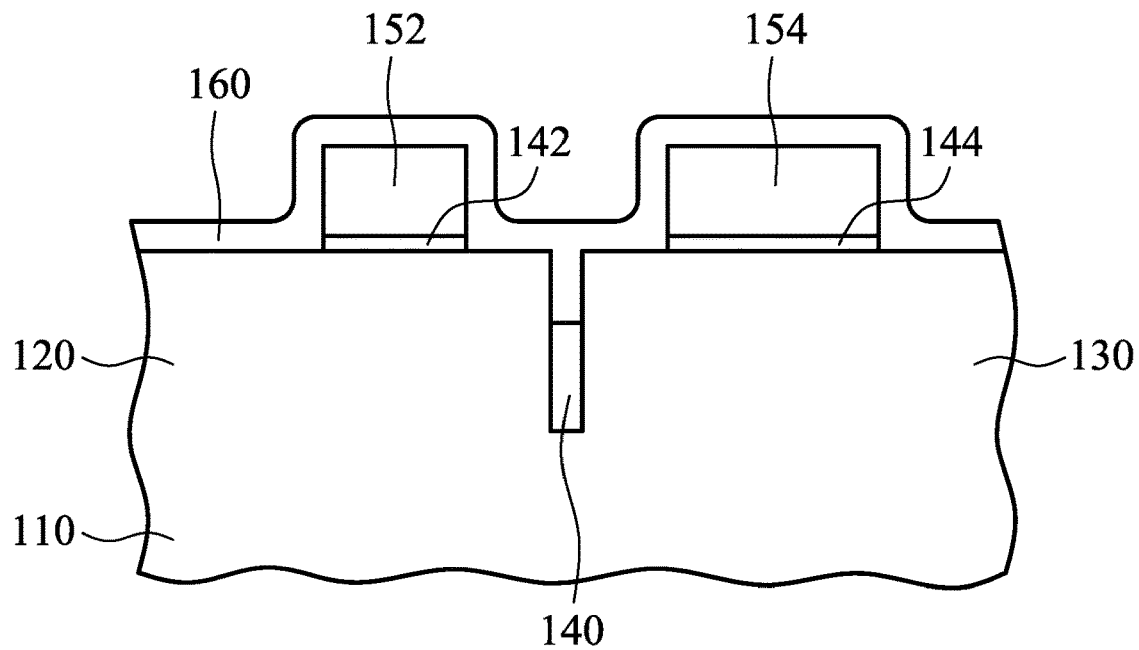
Figure 2C:
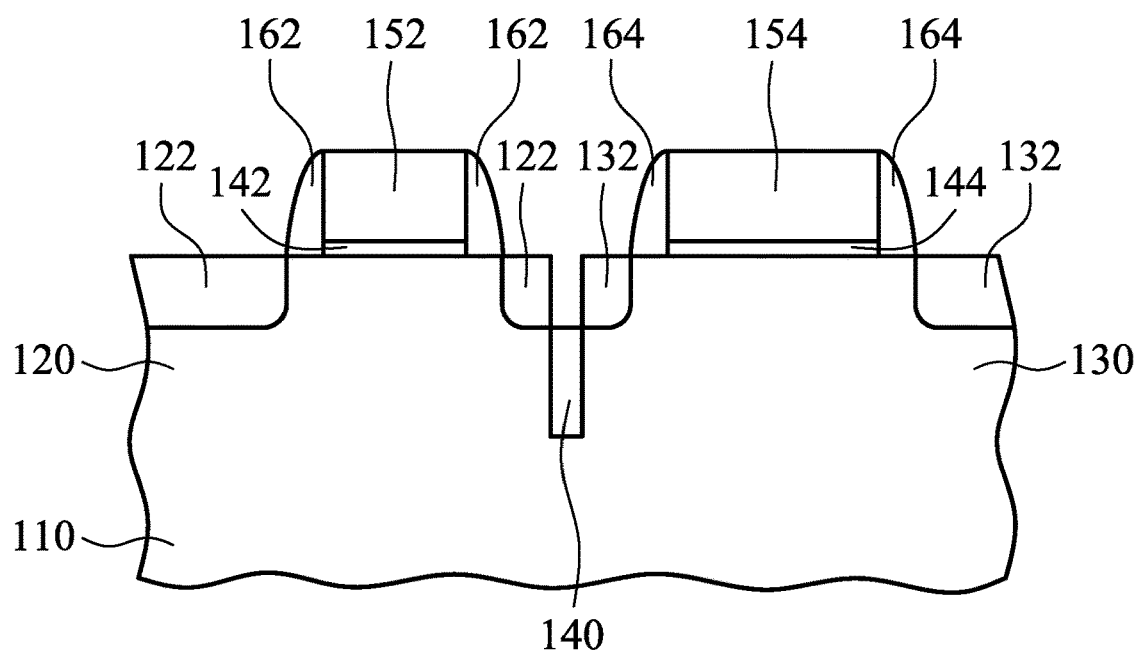
Figure 2D:
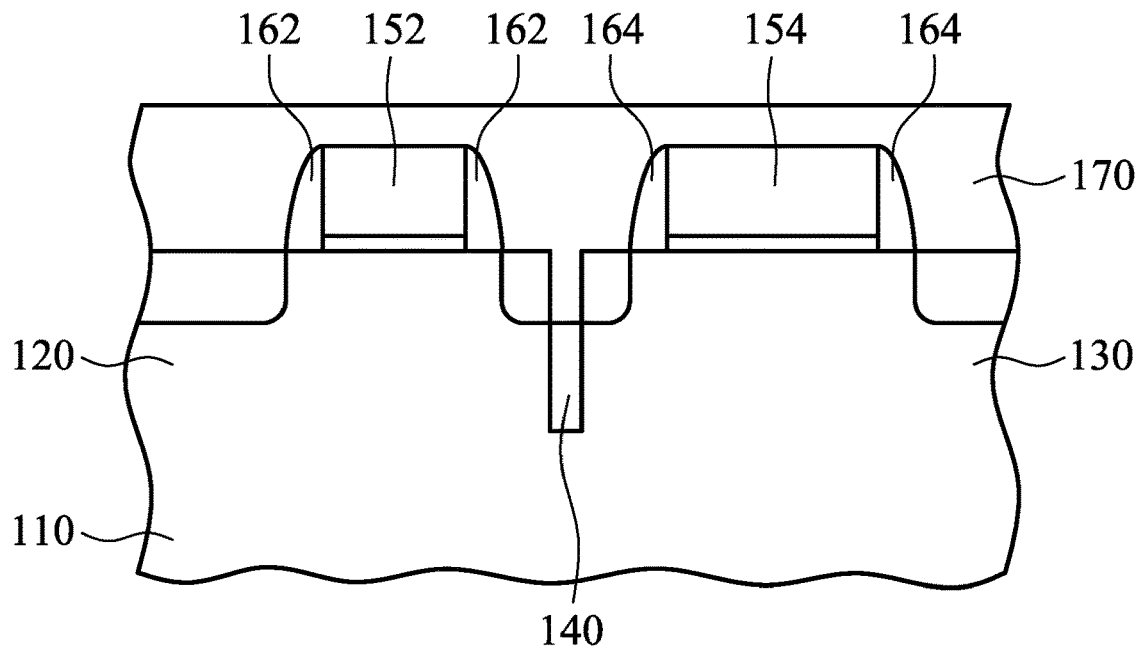
Figure 2E:
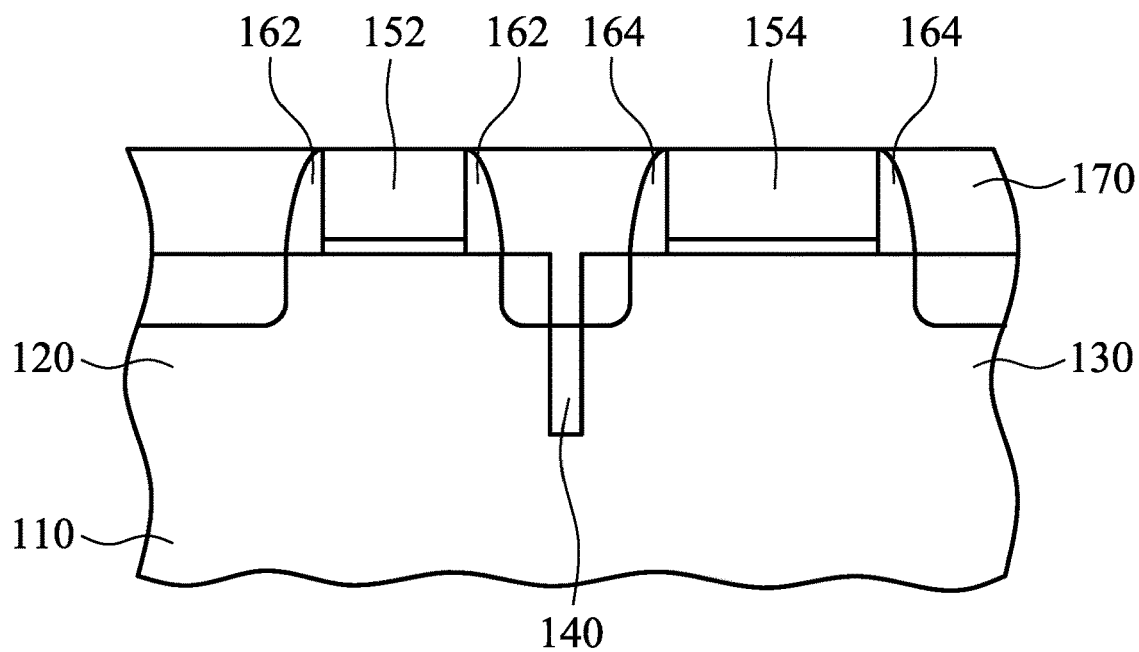
Figure 2F:
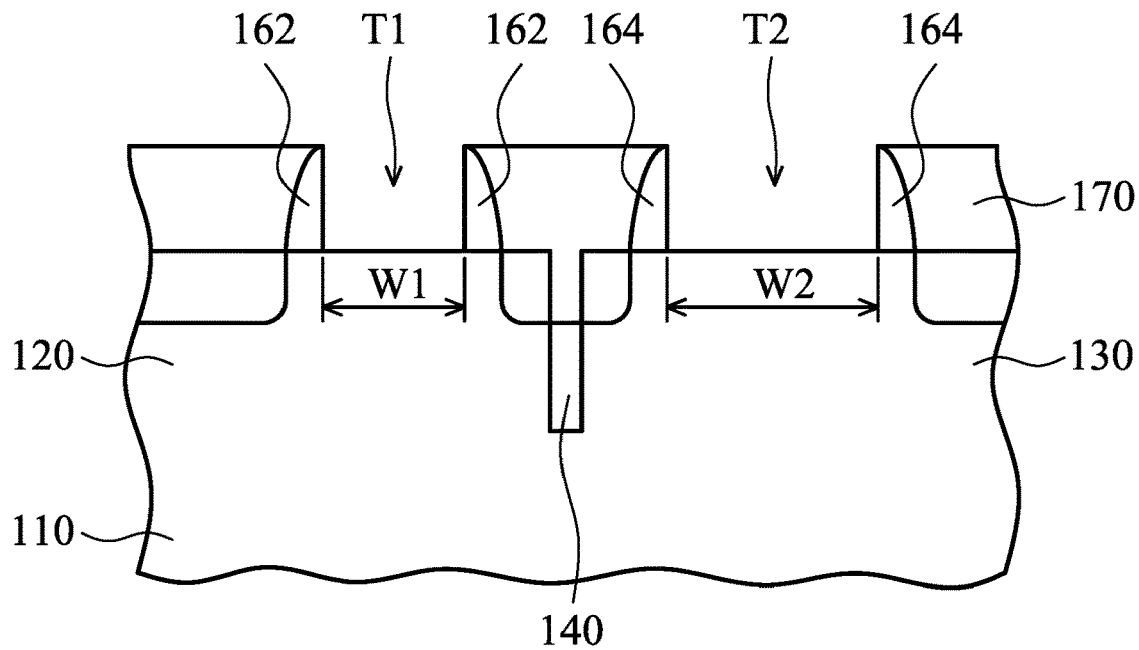
Figure 2G:
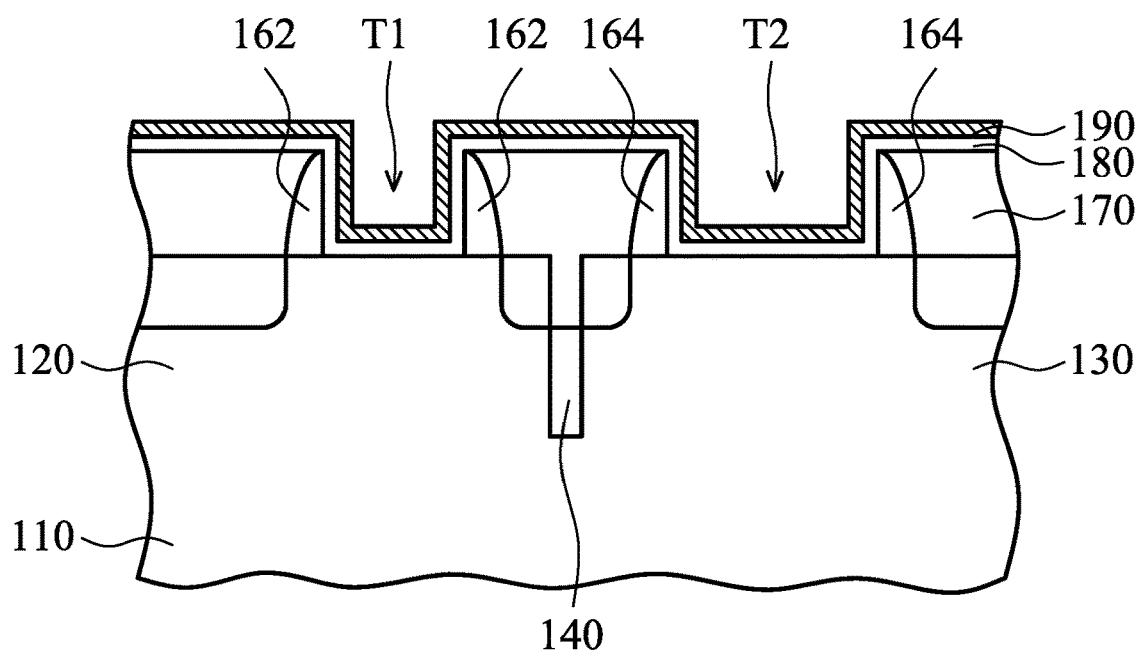
Figure 2H:
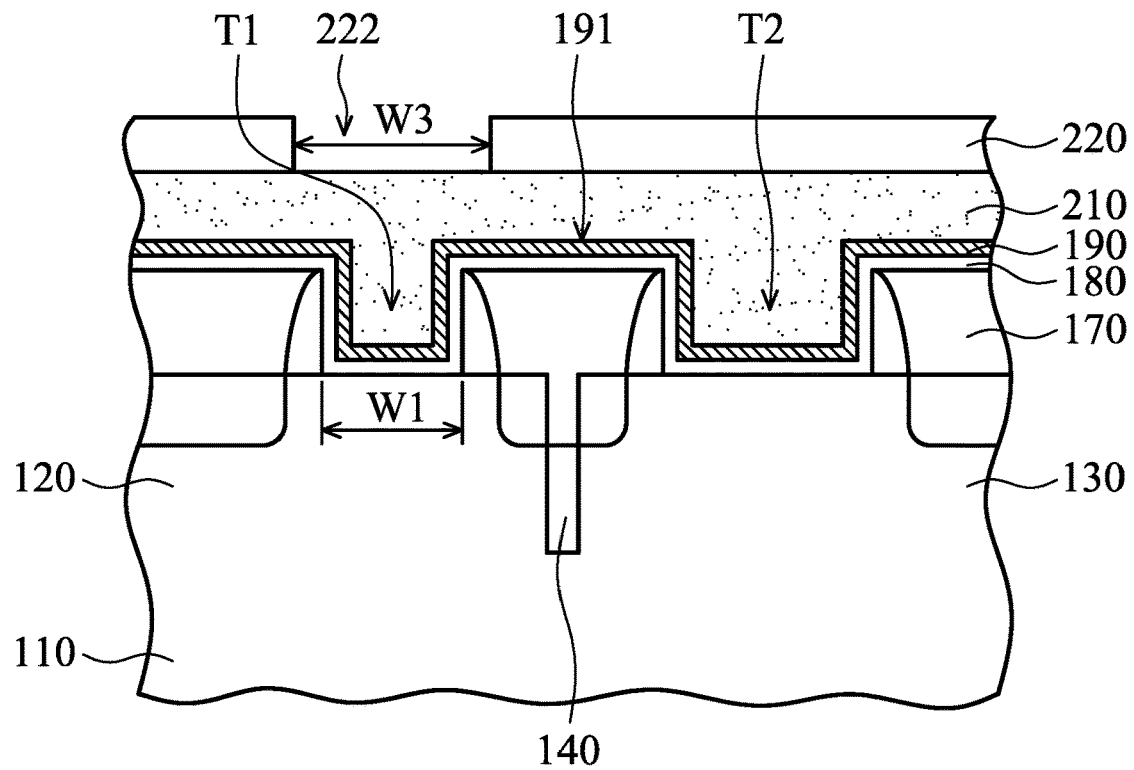
Figure 2I:
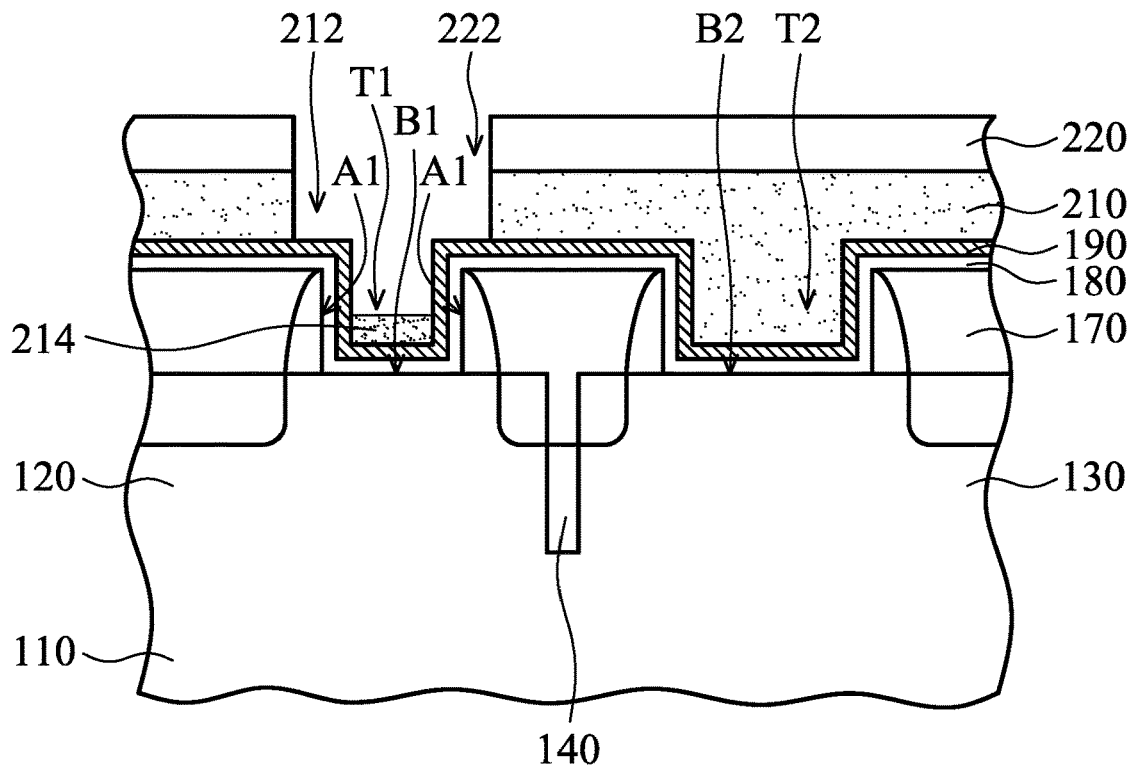
Figure 2J:
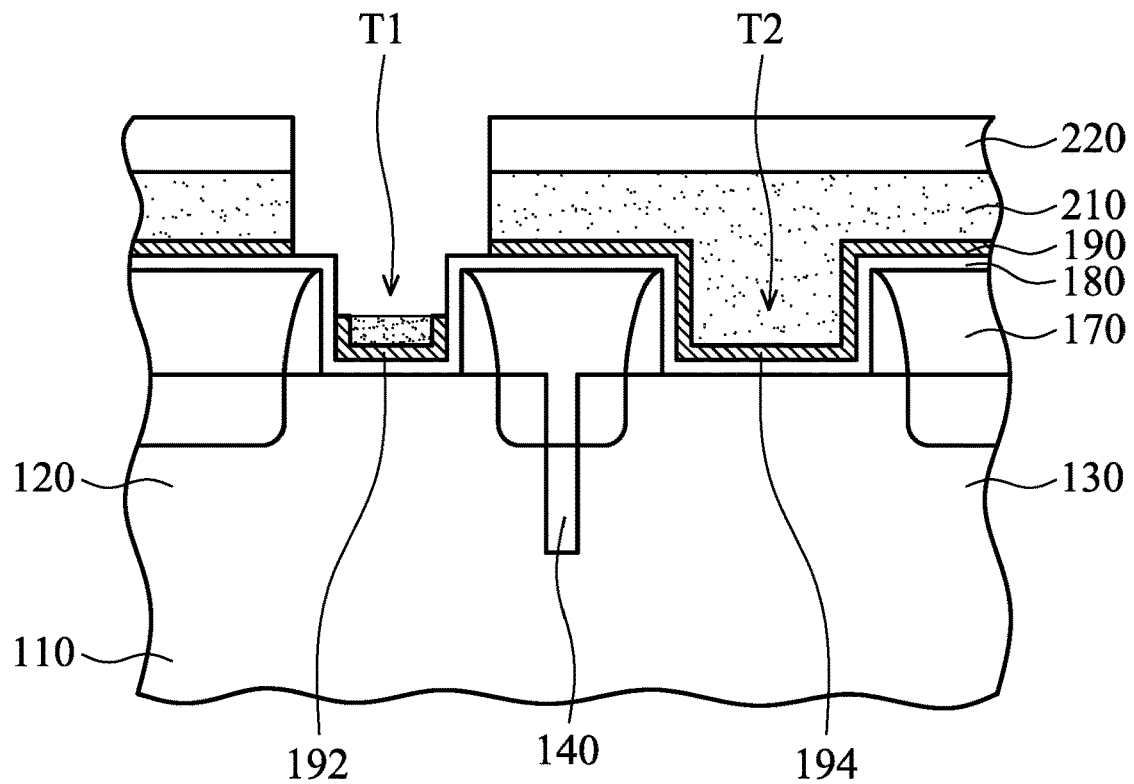
Figure 2K:
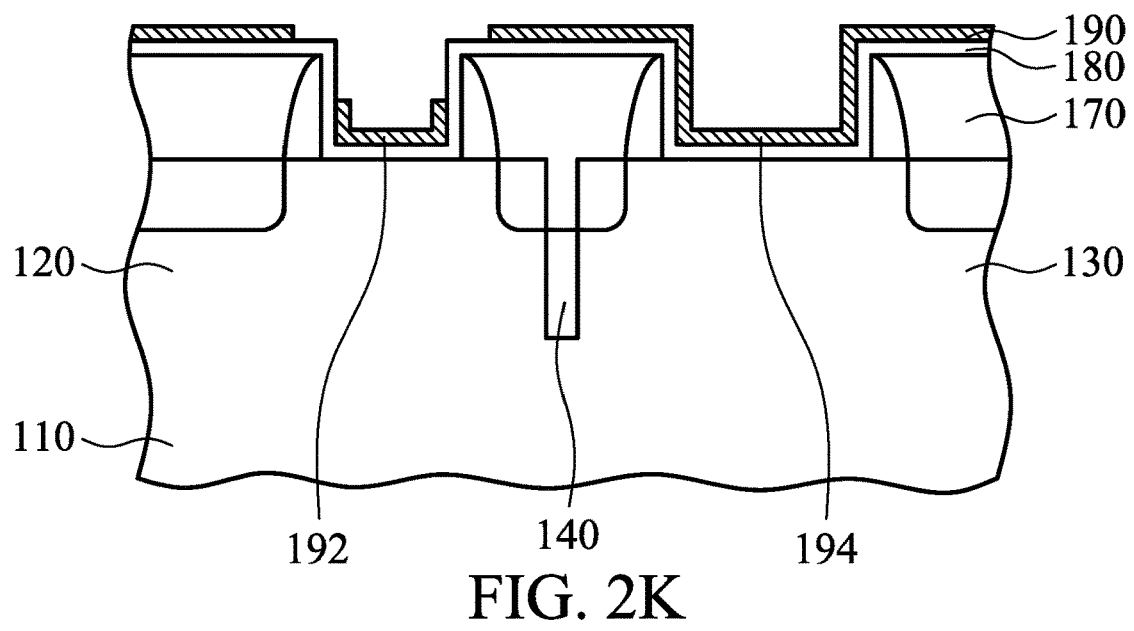
Figure 2L:
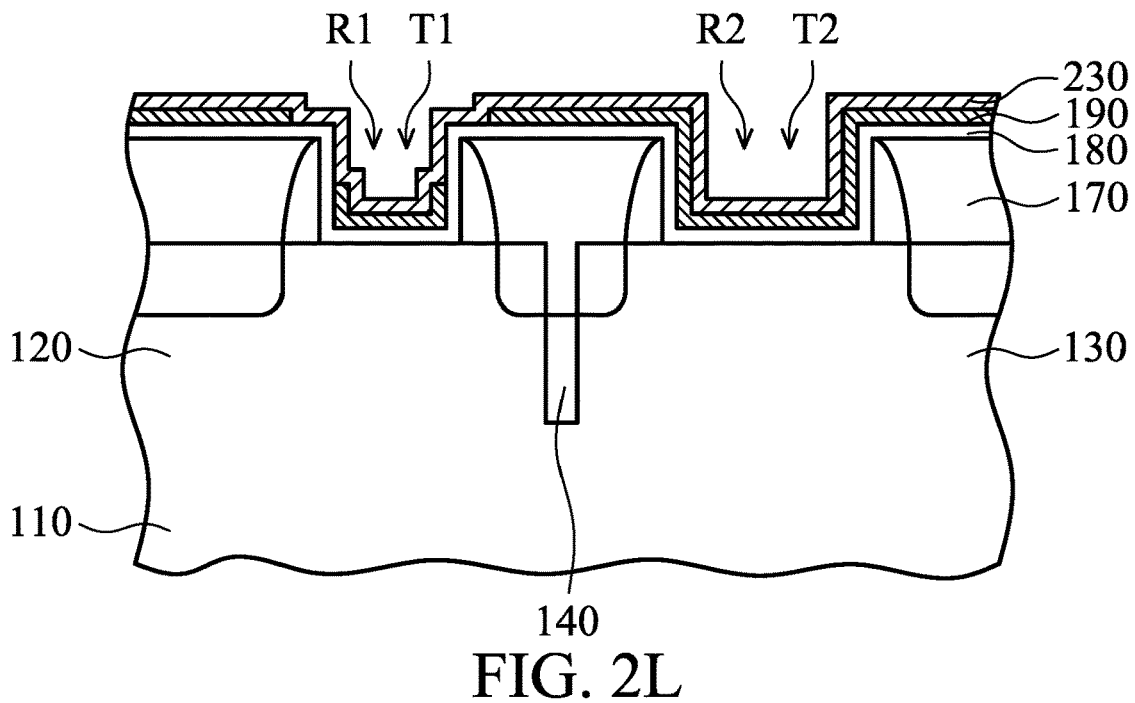
Figure 2M:
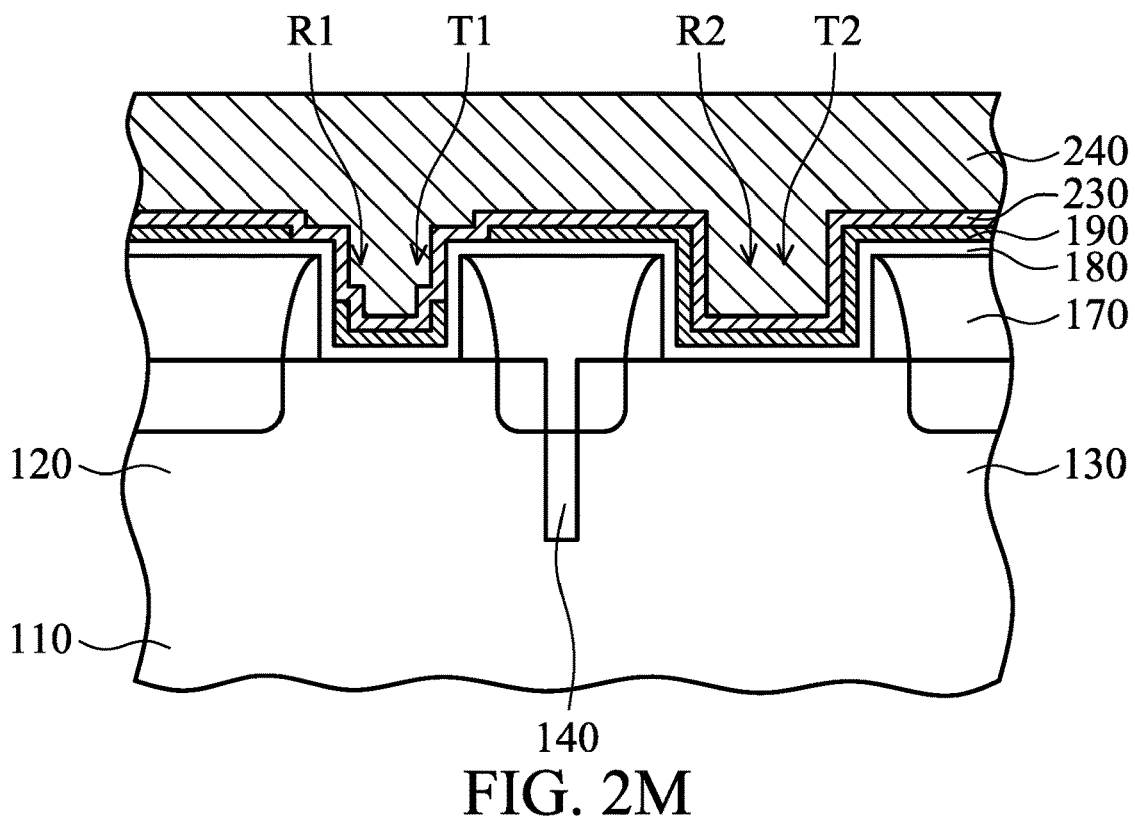
Figure 2N:
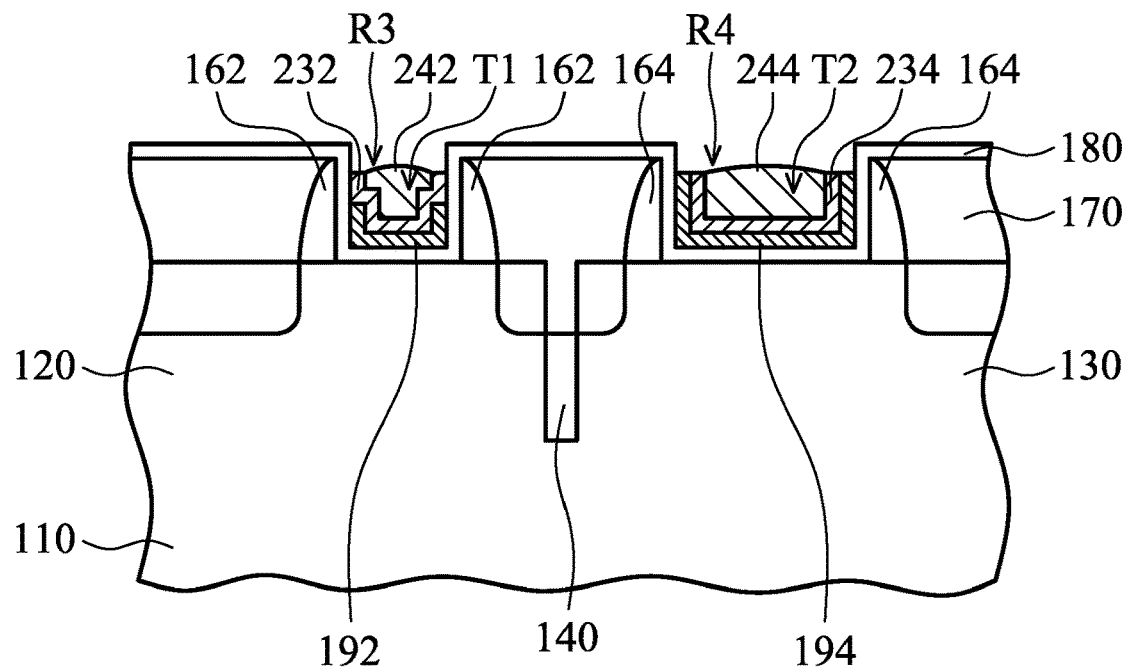
Figure 2O:
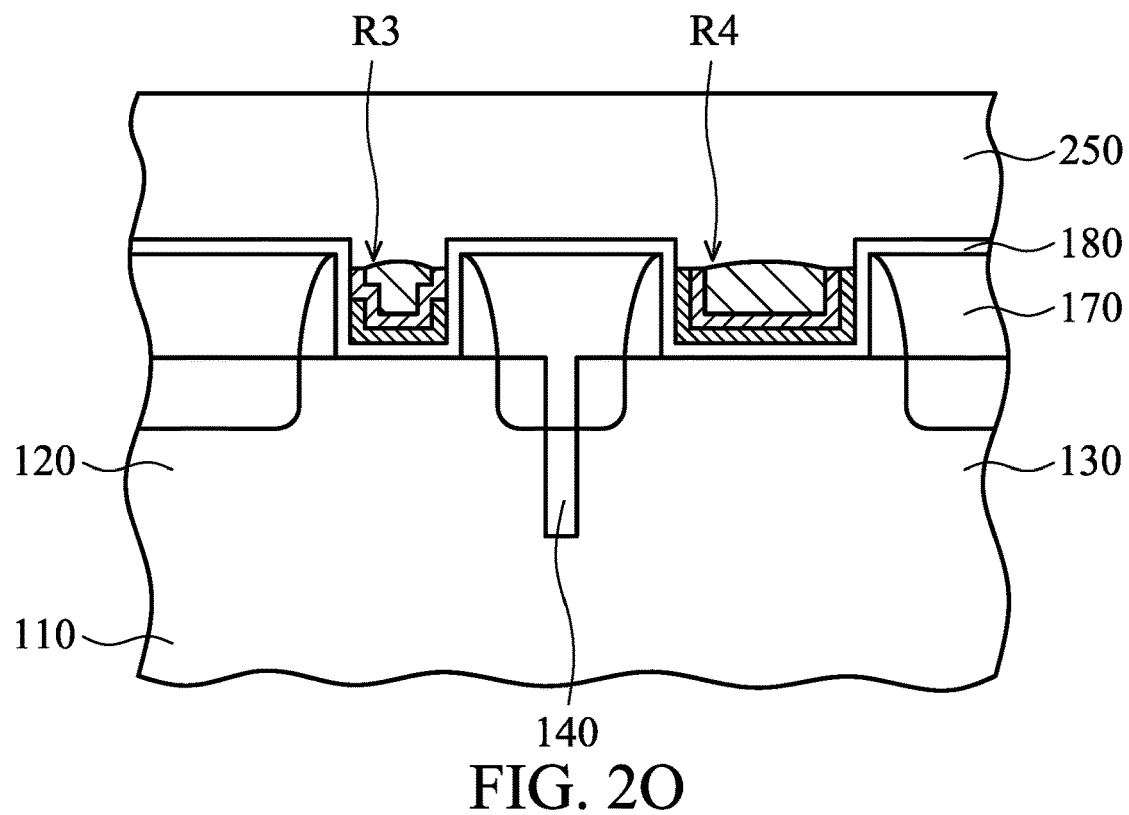
Figure 2P:
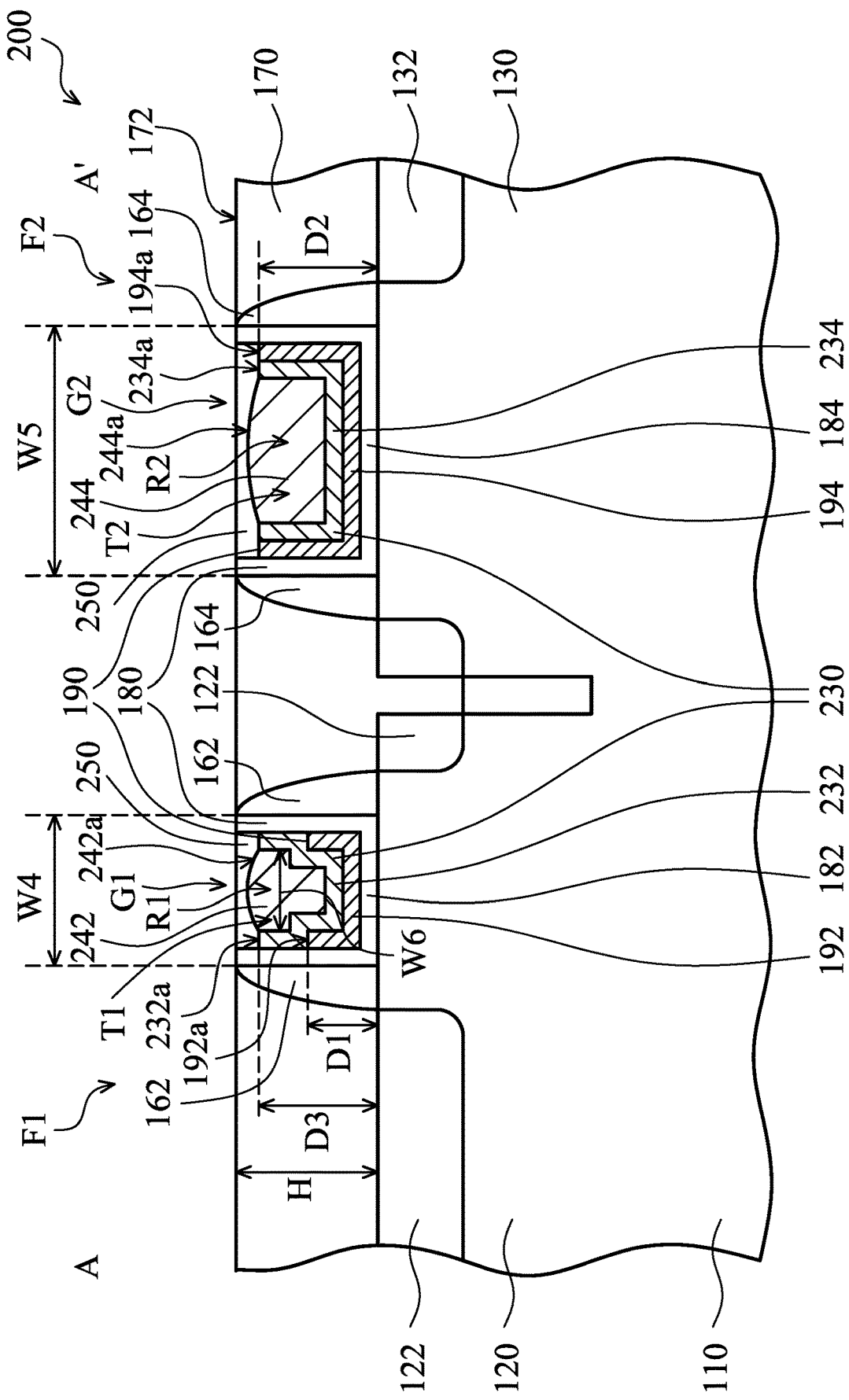
Figure 3A:
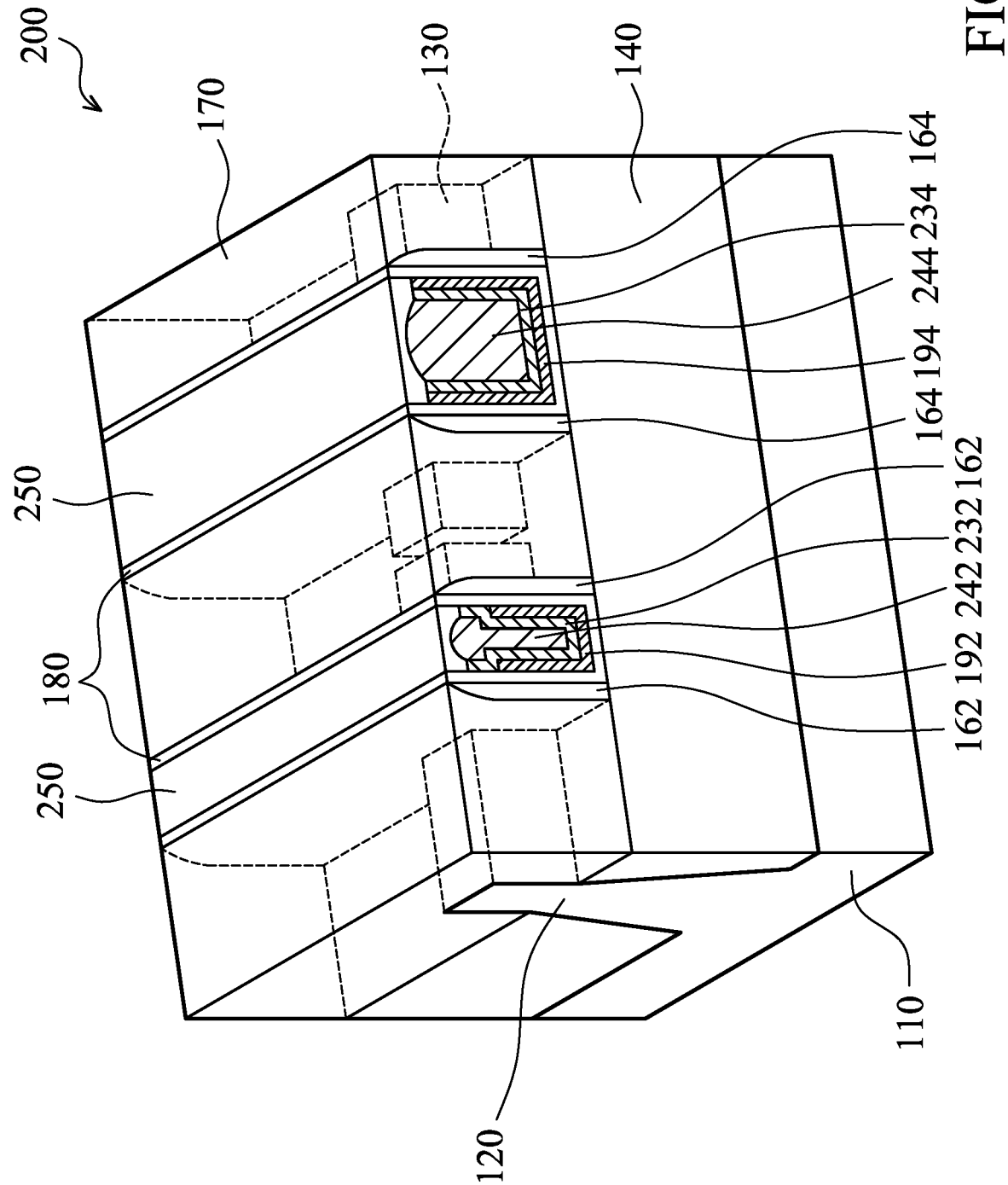
FIG. 3A is a perspective view of the semiconductor device structure of FIG. 2P, in accordance with some embodiments.
Figure 3B:
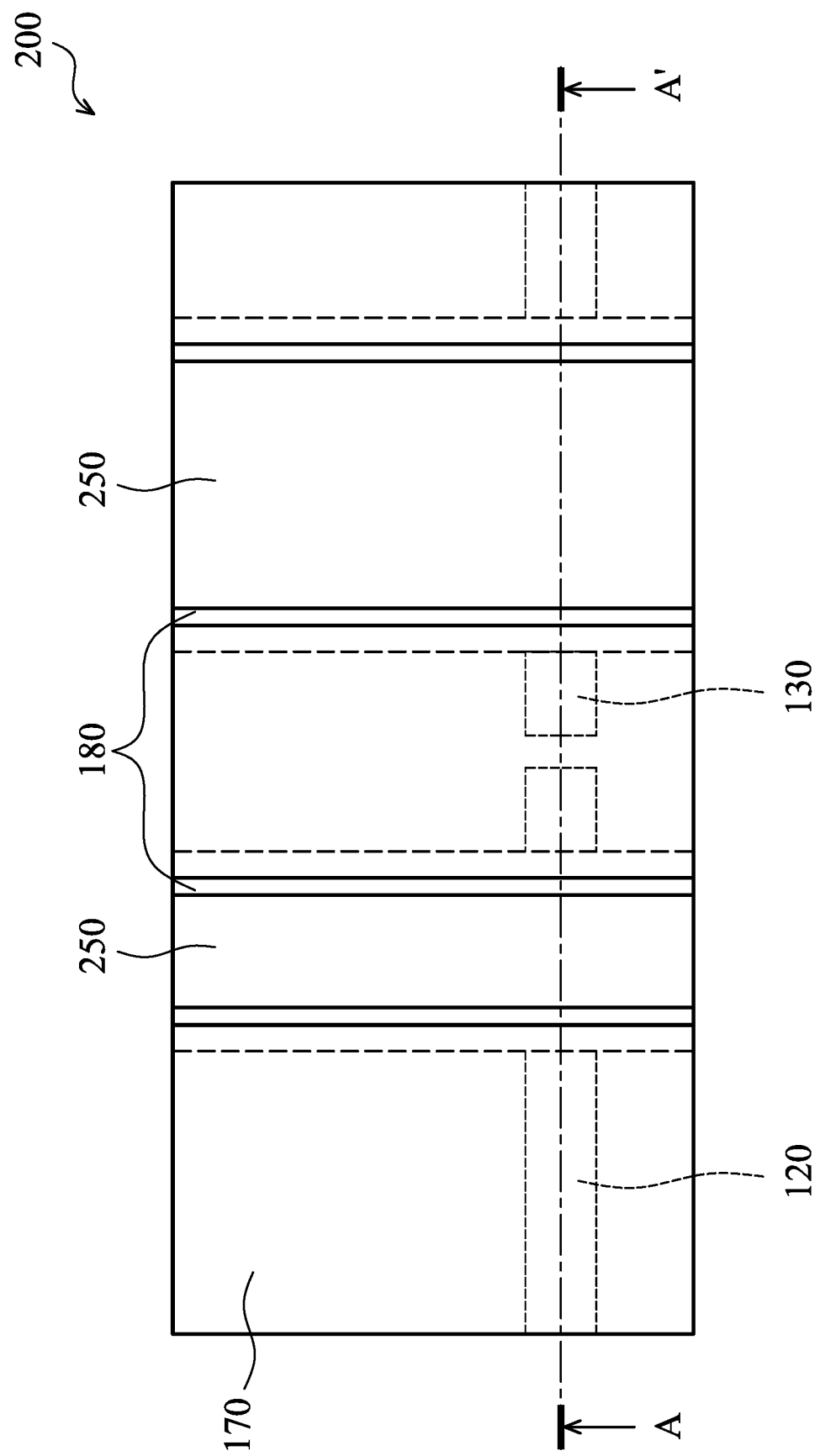
FIG. 3B is a top view of the semiconductor device structure of FIG. 2P, in accordance with some embodiments.

FIGS. 2A-2P are cross-sectional views of various stages of a process for forming a semiconductor device structure 200, in accordance with some embodiments. FIG. 3A is a perspective view of the semiconductor device structure 200 of FIG. 2P, in accordance with some embodiments. FIG. 3B is a top view of the semiconductor device structure 200 of FIG. 2P, in accordance with some embodiments. FIG. 2P is a cross-sectional view of the semiconductor device structure 200 taken along line A-A' in FIG. 3B, in accordance with some embodiments. In some embodiments, the semiconductor device structure 200 is a fin-type field effect transistor (FinFET).

After the stage of FIG. 2A, a spacer layer 160 is deposited over the isolation layer 140 to cover the dummy gate dielectric layers 142 and 144 and the dummy gates 152 and 154, as shown in FIG. 2B, in accordance with some embodiments. The spacer layer 160 includes an insulating material, such as silicon oxide or silicon nitride. The spacer layer 160 is formed using a chemical vapor deposition process, in accordance with some embodiments.

As shown in FIGS. 2B and 2C, an anisotropic etching process is performed to remove a portion of the spacer layer 160, in accordance with some embodiments. The spacer layer 160 remaining over the sidewalls of the dummy gate 152 and the dummy gate dielectric layer 142 forms spacers 162, in accordance with some embodiments.

The spacer layer 160 remaining over the sidewalls of the dummy gate 154 and the dummy gate dielectric layer 144 forms spacers 164, in accordance with some embodiments.

The spacers 162 and 164 are configured to electrically isolate a gate formed subsequently from other devices and configured to act as a mask layer in a subsequent ion implantation process, in accordance with some embodiments. The anisotropic etching process includes a dry etching process, in accordance with some embodiments.

As shown in FIG. 2C, heavily doped regions 122 and 132 are formed in the fin structures 120 and 130, respectively, in accordance with some embodiments. The heavily doped regions 122 and 132 are formed using an ion implantation process, in accordance with some embodiments. The ion implantation process is performed to introduce p-type impurities (e.g., boron) or n-type impurities (e.g., phosphorus) into the fin structures 120 and 130, in accordance with some embodiments.

The heavily doped regions 122 are a heavily doped source region and a heavily doped drain region, in accordance with some embodiments. The heavily doped regions 122 are located at the two opposite sides of the dummy gate 152, in accordance with some embodiments. The heavily doped regions 132 are a heavily doped source region and a heavily doped drain region, in accordance with some embodiments. The heavily doped regions 132 are located at the two opposite sides of the dummy gate 154, in accordance with some embodiments.

Thereafter, in some embodiments (not shown), stressors are formed in the heavily doped regions 122 and 132 by using suitable processes, in accordance with some embodiments. The suitable processes include, for example, an etching process for removing a portion of the fin structures 120 and 130 and a selective epitaxial growth (SEG) process. Depending on the desired type of the resulting FinFET device, either stressors applying a compressive stress to the channel region (such as SiGe stressors) or stressors applying a tensile stress to the channel region (such as SiC stressors) are formed.

Afterwards, in some embodiments (not shown), a contact etch stop layer is formed over the substrate 110 to cover the heavily doped regions 122 and 132, in accordance with some embodiments. The contact etch stop layer includes a dielectric material, in accordance with some embodiments. The contact etch stop layer includes silicon nitride, in accordance with some embodiments. It should be noted that, for the sake of simplicity, FIG. 2C does not show the stressors and the contact etch stop layer.

As shown in FIG. 2D, a dielectric layer 170 is deposited over the substrate 110, in accordance with some embodiments. The dielectric layer 170 covers the isolation layer 140, the fin structures 120 and 130, the dummy gates 152 and 154, and the spacers 162, in accordance with some embodiments. The dielectric layer 170 includes silicon oxide, silicon oxynitride, borosilicate glass (BSG), phosphoric silicate glass (PSG), borophosphosilicate glass (BPSG), fluorinated silicate glass (FSG), low-k material, porous dielectric material, or combinations thereof, in accordance with some embodiments. The dielectric layer 170 is deposited using a CVD process, a HDPCVD process, a spin-on process, a sputtering process, or a combination thereof, in accordance with some embodiments.

Afterwards, as shown in FIG. 2E, a planarization process is performed on the dielectric layer 170 until top surfaces of the dummy gates 152 and 154 are exposed, in accordance with some embodiments. The planarization process includes a chemical mechanical polishing (CMP) process, in accordance with some embodiments. After the planarization process is performed, the dielectric layer 170 has a substantially planar surface to facilitate subsequent process steps.

As shown in FIG. 2F, the dummy gates 152 and 154 are removed, in accordance with some embodiments. The removal process for removing the dummy gates 152 and 154 includes a wet etching process, a dry etching process, or a combination thereof, in accordance with some embodiments. In some embodiments, the dummy gate dielectric layers 142 and 144 are also removed.

After the dummy gates 152 and 154 and the dummy gate dielectric layers 142 and 144 are removed, a trench T1 is formed between the spacers 162, and a trench T2 is formed between the spacers 164, in accordance with some embodiments. The trench T1 exposes a portion of the fin structure 120, in accordance with some embodiments. The trench T2 exposes a portion of the fin structure 130, in accordance with some embodiments.

A width W1 of the trench T1 is less than a width W2 of the trench T2, in accordance with some embodiments. The width W1 ranges from about 10 nm to about 20 nm, in accordance with some embodiments. The width W2 ranges from about 26 nm to about 240 nm, in accordance with some embodiments. A difference between the width W2 and the width W1 ranges from about 6 nm to 230 nm, in accordance with some embodiments. A ratio of the width W2 to the width W1 ranges from about 1.3 to about 24, in accordance with some embodiments.

As shown in FIG. 2G, a gate dielectric layer 180 is formed to cover bottoms of the trenches T1 and T2, in accordance with some embodiments. The gate dielectric layer 180 further covers the inner walls of the trenches T1 and T2, top surfaces of the dielectric layer 170, and the spacers 162 and 164, in accordance with some embodiments.

The gate dielectric layer 180 includes a dielectric material, such as a high dielectric constant (high-k) material. The high-k material includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or combinations thereof.

The high-k material is made of metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, other suitable materials, or a combination thereof, in accordance with some embodiments.

The gate dielectric layer 180 is deposited by any suitable process, such as atomic layer deposition (ALD), chemical vapor deposition (CVD), physical vapor deposition (PVD), sputtering, plating, other suitable processes, or combinations thereof, in accordance with some embodiments. In some embodiments, the gate dielectric layer 180 needs to be further annealed.

An intermediate dielectric layer (not shown) may be formed over the fin structures 120 and 130 before the gate dielectric layer 180 is formed. The intermediate dielectric layer includes a suitable dielectric material, such as silicon oxide, hafnium silicate, silicon oxynitride, or combinations thereof.

As shown in FIG. 2G, a work function layer 190 is deposited over the gate dielectric layer 180, in accordance with some embodiments. The work function layer 190 provides a desired work function for transistors to enhance device performance including improved threshold voltage.

In the embodiments of forming an N-type FinFET, the work function layer 190 can be an n-type metal capable of providing a work function value suitable for the device, such as equal to or less than about 4.5 eV. The n-type metal includes metal, metal carbide, metal nitride, or combinations thereof, in accordance with some embodiments. For example, the n-type metal is made of tantalum, tantalum nitride, or combinations thereof.

On the other hand, in the embodiments of forming a P-type FinFET, the work function layer 190 can be a p-type metal capable of providing a work function value suitable for the device, such as equal to or greater than about 4.8 eV. The p-type metal includes metal, metal carbide, metal nitride, other suitable materials, or a combination thereof, in accordance with some embodiments.

For example, the p-type metal is made of titanium, titanium nitride, other suitable materials, or combinations thereof. The work function layer 190 is deposited using a PVD process, CVD process, ALD process, plating process, another suitable method, or combinations thereof, in accordance with some embodiments.

As shown in FIG. 2H, a mask layer 210 is formed over the work function layer 190, in accordance with some embodiments. In some embodiments, the mask layer 210 covers substantially the entire top surface 191 of the work function layer 190. In some embodiments, the mask layer 210 fills the trenches T1 and T2. The mask layer 210 includes a polymer material (such as a bottom anti-reflective coating material) or other suitable materials. The mask layer 210 is formed using a spin coating process, in accordance with some embodiments.

As shown in FIG. 2H, a mask layer 220 is formed over the mask layer 210, in accordance with some embodiments. The mask layer 220 has an opening 222 over the trench T1, in accordance with some embodiments. The opening 222 exposes the mask layer 210 over the trench T1, in accordance with some embodiments. In some embodiments, a width W3 of the opening 222 is greater than the width W1 of the trench T1. The mask layer 220 includes a photoresist material or another suitable material. The mask layers 210 and 220 are made of different materials, in accordance with some embodiments.

As shown in FIG. 2I, a portion of the mask layer 210 over and in the trench T1 is removed through the opening 222 to form an opening 212 in the mask layer 210, in accordance with some embodiments. The opening 212 exposes a portion of the work function layer 190 over inner walls A1 of the trench T1. A portion 214 of the mask layer 210 remains in the trench T1 to cover the work function layer 190 over a bottom surface B1 of the trench T1, in accordance with some embodiments. The portion of the mask layer 210 over and in the trench T1 is removed by a dry etching process, in accordance with some embodiments.

As shown in FIGS. 2I and 2J, the work function layer 190 exposed by the mask layer 210 is removed, in accordance with some embodiments. After the removal process, the work function layer 190 has a first portion 192 in the trench T1 and a second portion 194 in the trench T2, in accordance with some embodiments. In some embodiments, the work function layer 190 exposed by the mask layer 210 is removed by a wet etching process.

In some other embodiments (not shown), the mask layer 220 is not formed. Therefore, the removal of the mask layer 210 over and in the trench T1 further removes the mask layer 210 over and in the trench T2. However, since the width W2 of the trench T2 is greater than the width W1 of the trench T1, the mask layer 210 in the trench T2 may be over-etched due to the etching loading effect.

Therefore, the mask layer 210 in the trench T2 may expose a portion of the work function layer 190 over a bottom surface B2 of the trench T2. As a result, the fin structure 130 and the gate dielectric layer 180 over the bottom surface B2 may be damaged during the removal of the work function layer 190 exposed by the mask layer 210. Therefore, a gate leakage current ($I_{gt}$) of a FinFET with the damaged gate dielectric layer 180 and/or the damaged fin structure 130 may be increased.

For protecting the gate dielectric layer 180 over the bottom surface B2 and the fin structure 130 from damage, the etching depth of the mask layer 210 may be decreased. However, the mask layer 210 that remains in the trench T1 may be too thick to remove the work function layer 190, which is predetermined to be removed, from the sidewalls A1 of the trench T1. Therefore, the work function layer 190 remaining over the sidewalls A1 hinders a gate electrode from filling the trench T1, which may increase gate resistance of a FinFET with the gate electrode.

Therefore, the mask layer 220 of some embodiments may prevent the mask layer 210 over the trench T2 from being over-etched during the removal of the portion of the mask layer 210 over and in the trench T1. As a result, the mask layer 220 may protect the fin structure 130 and the gate dielectric layer 180 over the bottom surface B2 from damage, which decreases a gate leakage current of a FinFET with the undamaged gate dielectric layer 180 and the undamaged fin structure 130.

Furthermore, the etching depth of the mask layer 210 may be great enough to facilitate the removal of the work function layer 190, which is predetermined to be removed, from the sidewalls A1 of the trench T1, which facilitates the filling of the gate electrode into the trench T1. Therefore, gate resistance of a FinFET with the gate electrode filled in the trench T1 may be decreased.

As shown in FIG. 2K, the mask layers 210 and 220 are removed, in accordance with some embodiments. The mask layers 210 and 220 are removed by an ashing process and/or a wet etching process, in accordance with some embodiments. As shown in FIG. 2L, a work function layer 230 is formed over the work function layer 190, in accordance with some embodiments. The work function layer 230 has a recess R1 in the trench T1 and a recess R2 in the trench T2, in accordance with some embodiments. The work function layer 230 provides a desired work function for transistors to enhance device performance including improved threshold voltage. The work function layer 230 includes an n-type metal or a p-type metal, in accordance with some embodiments. The work function layers 190 and 230 are made of different materials, in accordance with some embodiments. The work function layer 230 is formed by a physical vapor deposition process or a chemical vapor deposition process, in accordance with some embodiments.

As shown in FIG. 2M, a gate electrode layer 240 (also called a metal gate electrode layer) is deposited over the work function layer 230 to fill the recesses R1 and R2, in accordance with some embodiments. The gate electrode layer 240 includes a suitable metal material, such as aluminum, tungsten, gold, platinum, cobalt, another suitable metal, an alloy thereof, or combinations thereof, in accordance with some embodiments. The gate electrode layer 240 is deposited using a PVD process, a CVD process, a plating process, the like, or combinations thereof, in accordance with some embodiments.

Afterwards, as shown in FIG. 2N, the gate electrode layer 240 and the work function layers 190 and 230 outside of the trenches T1 and T2, and portions of the gate electrode layer 240 and the work function layers 190 and 230 in the trenches T1 and T2 are removed, in accordance with some embodiments. The removal process includes a dry etching process, in accordance with some embodiments.

After the removal process, the work function layer 230 has a first portion 232 in the trench T1 and a second portion 234 in the trench T2, in accordance with some embodiments. After the removal process, the gate electrode layer 240 has a first gate electrode 242 in the trench T1 and a second gate electrode 244 in the trench T2, in accordance with some embodiments. In some embodiments, a recess R3 is formed between the spacers 162 and the first gate electrode 242, in accordance with some embodiments. In some embodiments, a recess R4 is formed between the spacers 164 and the second gate electrode 244, in accordance with some embodiments.

As shown in FIG. 2O, a hard mask layer 250 is formed over the gate dielectric layer 180 to fill the recesses R3 and R4, in accordance with some embodiments. The hard mask layer 250 includes silicon nitride, in accordance with some embodiments. The hard mask layer 250 is formed by a CVD process, a PVD process, or another suitable process.

As shown in FIGS. 2P, 3A, and 3B, the hard mask layer 250 and the gate dielectric layer 180 over a top surface 172 of the dielectric layer 170 are removed, in accordance with some embodiments. The removal process includes a planarization process, in accordance with some embodiments. The planarization process includes a chemical mechanical polishing (CMP) process or the like, in accordance with some embodiments.

After the planarization process, the gate dielectric layer 180 has a first portion 182 in the trench T1 and a second portion 184 in the trench T2, in accordance with some embodiments. The first gate electrode 242, the first portion 232 of the work function layer 230, the first portion 192 of the work function layer 190, and the first portion 182 of the gate dielectric layer 180 together form a first gate stack G1 (i.e., a metal gate stack), in accordance with some embodiments. The first gate stack G1 and the heavily doped regions 122 together form a first FinFET F1, in accordance with some embodiments.

The second gate electrode 244, the second portion 234 of the work function layer 230, the second portion 194 of the work function layer 190, and the second portion 184 of the gate dielectric layer 180 together form a second gate stack G2 (i.e., a metal gate stack), in accordance with some embodiments. The second gate stack G2 and the heavily doped regions 132 together form a second FinFET F2, in accordance with some embodiments.

In the first gate stack G1, a top surface 192a of the first portion 192 of the work function layer 190 is positioned above the fin structure 120 by a first distance D1, in accordance with some embodiments. In the second gate stack G2, a top surface 194a of the second portion 194 of the work function layer 190 is positioned above the fin structure 130 by a second distance D2, in accordance with some embodiments. The first distance D1 is less than the second distance D2, in accordance with some embodiments.

Since the first distance D1 is small, the recess R1 of the first portion 232 of the work function layer 230 is wide enough to be filled with the first gate electrode 242, in accordance with some embodiments. The first gate electrode 242 fills the recess R1, in accordance with some embodiments.

In the first gate stack G1, the first portion 232 of the work function layer 230 covers the top surface 192a of the first portion 192 of the work function layer 190, in accordance with some embodiments. In some embodiments, a top surface 232a of the first portion 232 of the work function layer 230 is positioned above the fin structure 120 by a third distance D3. The third distance D3 is greater than the first distance D1, in accordance with some embodiments. The gate electrode 242 has a convex curved surface 242a protruding beyond the top surface 232a, which facilitates electrical connection between the gate electrode 242 and a contact plug formed subsequently, in accordance with some embodiments.

In the second gate stack G2, the top surface 194a of the second portion 194 of the work function layer 190 is substantially aligned with a top surface 234a of the second portion 234 of the work function layer 230, in accordance with some embodiments. The gate electrode 244 has a convex curved surface 244a protruding beyond the top surface 234a, which facilitates electrical connection between the gate electrode 244 and a contact plug formed subsequently, in accordance with some embodiments.

The first gate stack G1 has a width W4, and the second gate stack G2 has a width W5, in accordance with some embodiments. The width W4 is less than the width W5, in accordance with some embodiments. A ratio of the width W5 of the second gate stack G2 to the width W4 of the first gate stack G1 ranges from about 1.3 to about 24, in accordance with some embodiments. A difference between the width W5 of the second gate stack G2 and the width W4 of the first gate stack G1 ranges from about 6 nm to about 230 nm, in accordance with some embodiments.

The spacers 162 are disposed over sidewalls of the first gate stack G1, and the spacers 164 are disposed over sidewalls of the second gate stack G2, in accordance with some embodiments. The spacer 162 has a thickness H, in accordance with some embodiments. A difference of the thickness H and the first distance D1 ranges from about 400 Å to about 600 Å, in accordance with some embodiments. A ratio (D1/H) of the first distance D1 to the thickness H ranges from about 0.1 to about 0.5, in accordance with some embodiments.

The ratio (D1/H) is required to be maintained within a suitable range, in accordance with some embodiments. If the ratio (D1/H) is greater than 0.5, the first portion 192 of the work function layer 190 may reduce the width W6 of most of the recess R1, which may hinder the gate electrode 242 from filling the recess R1, in accordance with some embodiments.

The ratio (D1/H) of the embodiments is low enough to result in an adequate wide of most of the recess R1, which facilitates the filling of the gate electrode 242 into the recess R1, in accordance with some embodiments. Therefore, gate resistance of the FinFET F1 may be decreased.

Figure 4A:
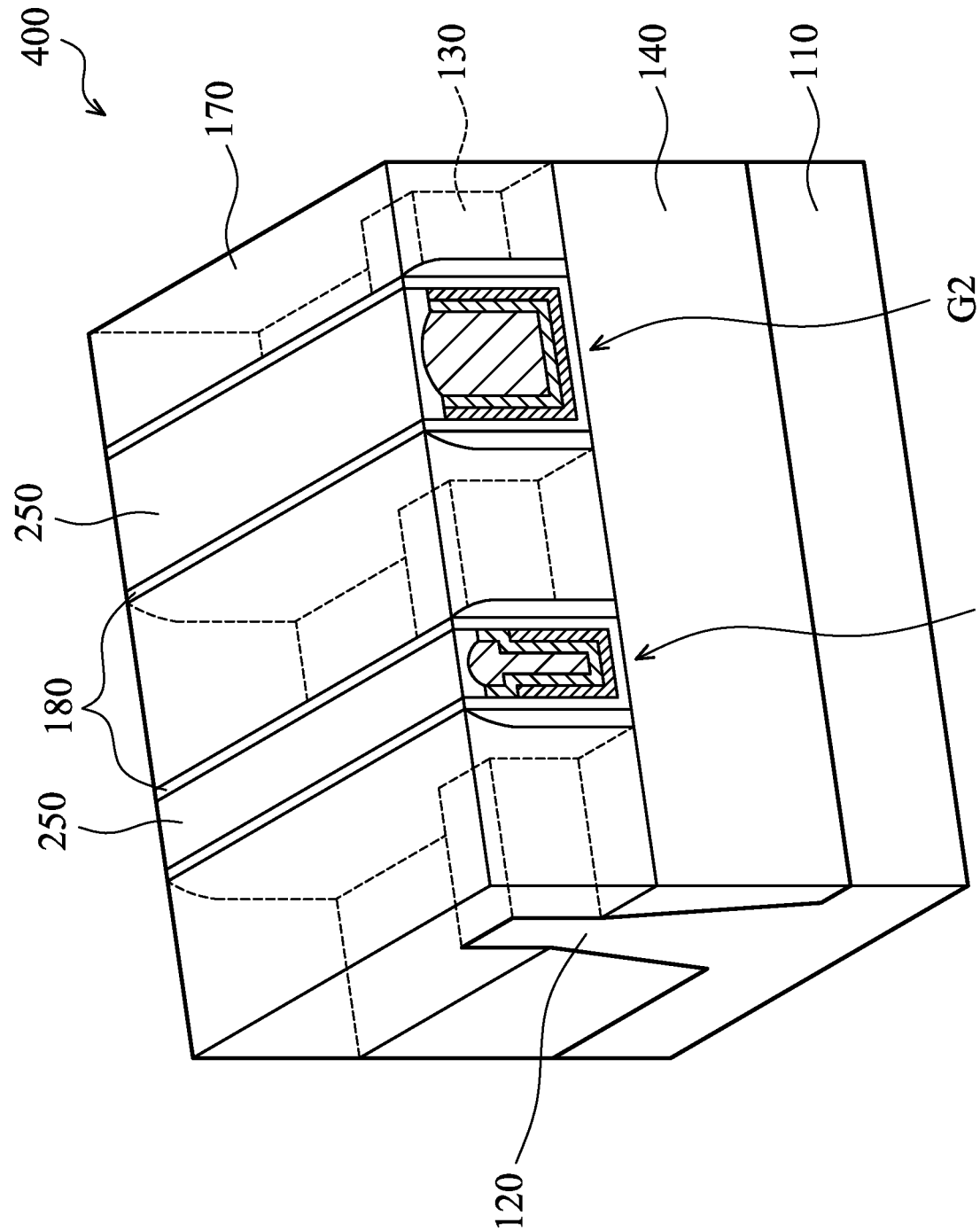
FIG. 4A is a perspective view of a semiconductor device structure, in accordance with some embodiments.
Figure 4B:
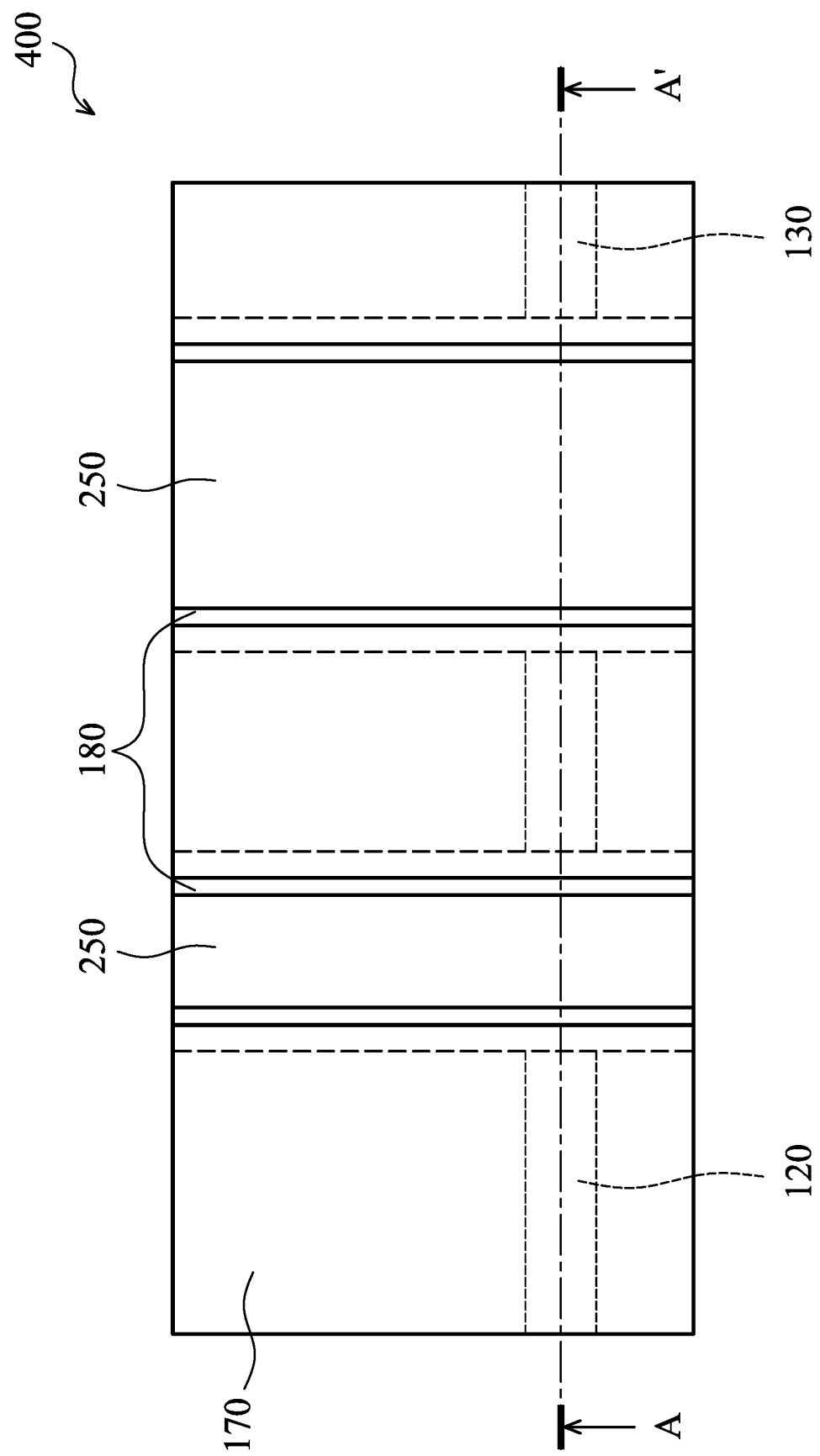
FIG. 4B is a top view of the semiconductor device structure of FIG. 4A, in accordance with some embodiments.
Figure 4C:
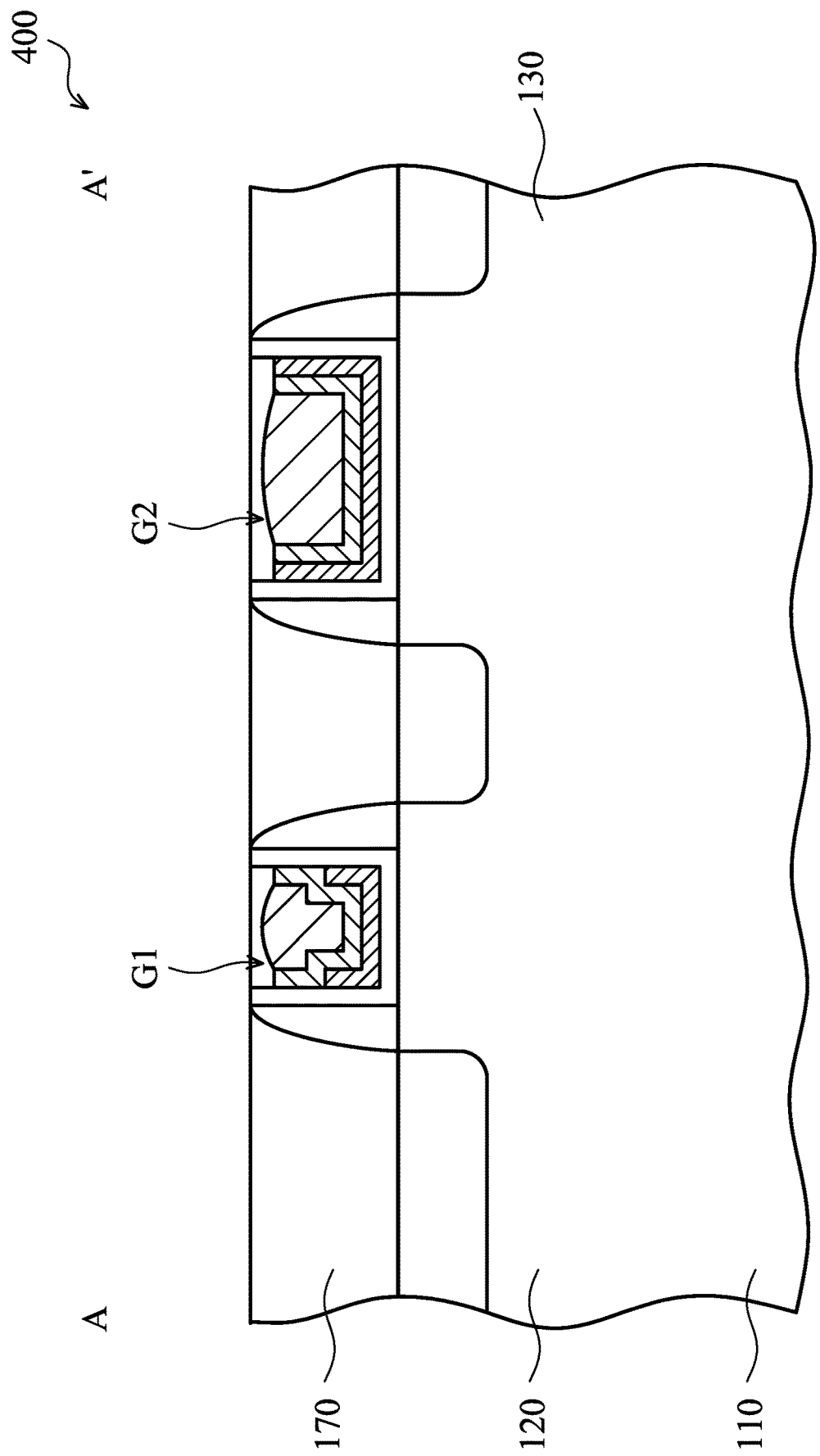
FIG. 4C is a cross-sectional view of the semiconductor device structure taken along line A-A' in FIG. 4B, in accordance with some embodiments.

FIG. 4A is a perspective view of a semiconductor device structure 400, in accordance with some embodiments. FIG. 4B is a top view of the semiconductor device structure 400 of FIG. 4A, in accordance with some embodiments. FIG. 4C is a cross-sectional view of the semiconductor device structure 400 taken along line A-A' in FIG. 4B, in accordance with some embodiments. As shown in FIGS. 4A-4C, the semiconductor device structure 400 is similar to the semiconductor device structure 200, except that the fin structures 120 and 130 are connected to each other, in accordance with some embodiments.

In accordance with some embodiments, semiconductor device structures and methods for forming the same are provided. The methods (for forming the semiconductor device structure) form a first gate stack overlapping a first fin structure, and a second gate stack overlapping a second fin structure. The first gate stack and the second gate stack are located in a first trench and a second trench of a dielectric layer, respectively. The dielectric layer covers the first fin structure and the second fin structure. A first width of the first trench is less than a second width of the second trench. Before etching a portion of a work function layer in the first trench, the methods form a mask layer to cover the second trench so as to protect a work function layer and a gate dielectric layer in the second trench and the second fin structure from being over-etched due to the loading effect caused by the difference between the first width and the second width. Therefore, a gate leakage current ($I_{gi}$) of a FinFET with the undamaged gate dielectric layer and/or the undamaged fin structure is reduced.

In accordance with some embodiments, a method for forming a semiconductor device structure is provided. The method includes forming a first fin structure and a second fin structure over a substrate. The method includes forming a dielectric layer over the substrate, the first fin structure, and the second fin structure. The dielectric layer has a first trench exposing a first portion of the first fin structure and a second trench exposing a second portion of the second fin structure. The method includes forming a first work function layer in the first trench and the second trench. The method includes forming a first mask layer over the first work function layer in the first trench. The method includes removing the first work function layer exposed by the first mask layer. The method includes removing the first mask layer. The method includes forming a first gate electrode in the first trench and a second gate electrode in the second trench. The method includes forming a first hard mask layer in the first trench and a second hard mask layer in the second trench. The first hard mask layer has a first concave curved bottom surface, and the first gate electrode is in direct contact with the first concave curved bottom surface.

In accordance with some embodiments, a semiconductor device structure is provided. The semiconductor device structure includes a substrate. The semiconductor device structure includes a first fin structure and a second fin structure disposed over the substrate. The semiconductor device structure includes a first gate stack disposed over the substrate and overlapping the first fin structure. The first gate stack includes a first gate dielectric layer, a first work function layer, a second work function layer, and a first gate electrode sequentially stacked over the first fin structure, and a first topmost surface of the second work function layer is higher than a second topmost surface of the first work function layer and is lower than a third topmost surface of the first gate dielectric layer. The semiconductor device structure includes a second gate stack disposed over the substrate and overlapping the second fin structure. The second gate stack is wider than the first gate stack.

In accordance with some embodiments, a semiconductor device structure is provided. The semiconductor device structure includes a substrate. The semiconductor device structure includes a first fin structure and a second fin structure disposed over the substrate. The semiconductor device structure includes a first gate stack disposed over the substrate and overlapping the first fin structure. The first gate stack includes a first gate dielectric layer, a first work function layer, a second work function layer, and a first gate electrode, and the second work function layer covers a first topmost surface of the first work function layer and exposes an upper portion of a sidewall of the first gate dielectric layer. The semiconductor device structure includes a second gate stack disposed over the substrate and overlapping the second fin structure. The second gate stack includes a second gate dielectric layer, a third work function layer, and a second gate electrode sequentially stacked over the second fin structure, and the second gate electrode is wider than the first gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a first fin structure and a second fin structure over a substrate;
   forming a dielectric layer over the substrate, the first fin structure, and the second fin structure, wherein the dielectric layer has a first trench exposing a first portion of the first fin structure and a second trench exposing a second portion of the second fin structure;
   forming a first work function layer in the first trench and the second trench;
   forming a first mask layer over the first work function layer in the first trench;
   removing the first work function layer exposed by the first mask layer;
   removing the first mask layer;
   forming a first gate electrode in the first trench and a second gate electrode in the second trench; and
   forming a first hard mask layer in the first trench and a second hard mask layer in the second trench, wherein the first hard mask layer has a first concave curved bottom surface, and the first gate electrode is in direct contact with the first concave curved bottom surface.

2. The method for forming the semiconductor device structure as claimed in claim 1, wherein the first gate electrode has a convex curved top surface facing the first concave curved bottom surface of the first hard mask layer.

3. The method for forming the semiconductor device structure as claimed in claim 1, wherein the second hard mask layer has a second concave curved bottom surface.

4. The method for forming the semiconductor device structure as claimed in claim 3, wherein the second gate electrode is in direct contact with the second concave curved bottom surface.

5. The method for forming the semiconductor device structure as claimed in claim 4, wherein the second gate electrode has a convex curved top surface facing the second concave curved bottom surface of the second hard mask layer.

6. The method for forming the semiconductor device structure as claimed in claim 1, wherein a first top surface of the first mask layer is substantially level with a second top surface of the first work function layer in the first trench after the removing of the first work function layer exposed by the first mask layer.

7. The method for forming a semiconductor device structure as claimed in claim 1, wherein the forming of the first mask layer over the first work function layer in the first trench comprises:
   forming a mask material layer over the first fin structure, the substrate, and the first work function layer;
   forming a second mask layer over the mask material layer, wherein the second mask layer has an opening over the first trench; and
   removing a second portion of the mask material layer in the first trench through the opening, wherein after the removal of the second portion, the mask material layer remained in the first trench forms the first mask layer, and the removing of the first mask layer comprises removing the second mask layer.

8. The method for forming a semiconductor device structure as claimed in claim 1, further comprising:
   before the formation of the first gate electrode and the second gate electrode, forming a second work function layer over the first work function layer, wherein the first gate electrode is formed over the second work function layer in the first trench, and the second gate electrode is formed over the second work function layer in the second trench.

9. The method for forming the semiconductor device structure as claimed in claim 8, wherein the first gate electrode has a convex curved surface protruding beyond a topmost surface of the second work function layer and in direct contact with the first concave curved bottom surface of the first hard mask layer.

10. The method for forming the semiconductor device structure as claimed in claim 1, wherein the second gate electrode is wider than the first gate electrode.

11. A semiconductor device structure, comprising:
    a substrate;
    a first fin structure and a second fin structure disposed over the substrate;
    a first gate stack disposed over the substrate and overlapping the first fin structure, wherein the first gate stack comprises a first gate dielectric layer, a first work function layer, a second work function layer, and a first gate electrode sequentially stacked over the first fin structure, and a first topmost surface of the second work function layer is higher than a second topmost surface of the first work function layer and is lower than a third topmost surface of the first gate dielectric layer; and
    a second gate stack disposed over the substrate and overlapping the second fin structure, wherein the second gate stack is wider than the first gate stack.

12. The semiconductor device structure as claimed in claim 11, wherein the second topmost surface of the first work function layer is lower than a fourth topmost surface of the second gate stack.

13. The semiconductor device structure as claimed in claim 12, wherein the second gate stack comprises a second gate dielectric layer, a third work function layer, a fourth work function layer, and a second gate electrode sequentially stacked over the second fin structure.

14. The semiconductor device structure as claimed in claim 13, wherein the second topmost surface of the first work function layer is lower than a fifth topmost surface of the third work function layer, and the first work function layer and the third work function layer are made of a same material.

15. The semiconductor device structure as claimed in claim 13, wherein the second topmost surface of the first work function layer is lower than a fifth topmost surface of the fourth work function layer, and the second work function layer and the fourth work function layer are made of a same material.

16. A semiconductor device structure, comprising:
 a substrate;
 a first fin structure and a second fin structure disposed over the substrate;
 a first gate stack disposed over the substrate and overlapping the first fin structure, wherein the first gate stack comprises a first gate dielectric layer, a first work function layer, a second work function layer, and a first gate electrode, and the second work function layer covers a first topmost surface of the first work function layer and exposes an upper portion of a sidewall of the first gate dielectric layer; and
 a second gate stack disposed over the substrate and overlapping the second fin structure, wherein the second gate stack comprises a second gate dielectric layer, a third work function layer, and a second gate electrode sequentially stacked over the second fin structure, and the second gate electrode is wider than the first gate electrode.

17. The semiconductor device structure as claimed in claim 16, wherein the first topmost surface of the first work function layer is lower than a second topmost surface of the third work function layer.

18. The semiconductor device structure as claimed in claim 17, wherein the first work function layer and the third work function layer have a substantially same thickness.

19. The semiconductor device structure as claimed in claim 18, wherein the first work function layer and the third work function layer are made of a same material.

20. The semiconductor device structure as claimed in claim 16, wherein the second gate stack further comprises a fourth work function layer over the third work function layer, and a second topmost surface of the third work function layer and a third topmost surface of the fourth work function layer are substantially coplanar.

* * * * *